(12) United States Patent  
Kawasumi

(10) Patent No.: US 7,477,560 B2  
(45) Date of Patent: Jan. 13, 2009

(54) SEMICONDUCTOR INTEGRATED CIRCUIT DEVICE AND TRIMMING METHOD OF SEMICONDUCTOR INTEGRATED CIRCUIT DEVICE

(75) Inventor: Atsushi Kawasumi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 97 days.

(21) Appl. No.: 11/697,059

(22) Filed: Apr. 5, 2007

(65) Prior Publication Data

US 2007/0242499 A1 Oct. 18, 2007

(30) Foreign Application Priority Data

Apr. 7, 2006 (JP) ............................. 2006-106649

(51) Int. Cl.
*G11C 7/02* (2006.01)
(52) U.S. Cl. ...................................... 365/207; 365/205
(58) Field of Classification Search ................. 365/207, 365/205, 154

See application file for complete search history.

(56) References Cited

U.S. PATENT DOCUMENTS

| | | | | |
|---|---|---|---|---|
| 5,023,841 A | * | 6/1991 | Akrout et al. | ............... 365/205 |
| 5,675,535 A | * | 10/1997 | Jinbo | ...................... 365/185.2 |
| 6,584,026 B2 | | 6/2003 | Kawasumi | |
| 2006/0274590 A1 | * | 12/2006 | Fujita et al. | .................. 365/207 |

* cited by examiner

*Primary Examiner*—Anh Phung
(74) *Attorney, Agent, or Firm*—Oblon, Spivak, McClelland, Maier & Neustadt, P.C.

(57) ABSTRACT

This disclosure concerns a LSI comprising two bit lines; two input nodes; sense nodes transmitting a signal difference input to the two input nodes; an output node outputting the amplified signal; a current adjustment gate adjusting an amount of current flowing through one of the two sense nodes; a latch circuit controlling the current adjustment gate; two signal lines transmitting a voltage source and a comparison voltage via the two input nodes, the comparison voltage being obtained by subtracting a predetermined threshold voltage from the power source voltage; and two switching elements provided between the two input nodes and the two signal lines, wherein the latch circuit switches the current adjustment gate in the case where the amplified signal is an inversion signal of an amplified signal according to the threshold voltage when the power source voltage and the comparison voltage are respectively applied to the two input nodes.

18 Claims, 9 Drawing Sheets

SEMICONDUCTOR INTEGRATED CIRCUIT DEVICE AND TRIMMING METHOD OF SEMICONDUCTOR INTEGRATED CIRCUIT DEVICE

CROSS-REFERENCE TO RELATED APPLICATION

This application is based upon and claims the benefit of priority from the prior Japanese Patent Applications No. 2006-106649, filed on Apr. 7, 2006, the entire contents of which are incorporated herein by reference.

BACKGROUND OF THE INVENTION

1. Field of the Invention

The present invention relates to a semiconductor integrated circuit device and a trimming method of a semiconductor integrated circuit device and, for example to a semiconductor integrated circuit device having a sense amplifier with a trimming function and a trimming method of the same.

2. Related Art

In a semiconductor memory device typified by an SRAM (Static Random Access Memory) and the like, a potential difference between paired bit lines according to data of a memory cell is amplified by a sense amplifier, and the potential difference is output as data. Generally, a sense amplifier is constructed with a MOSFET (Metal-Oxide Semiconductor Field Effect Transistor) in consideration of the low power consumption characteristic and the like. The sense amplifier constructed with a MOSFET has an offset voltage. The offset voltage is the minimum potential difference between paired bit lines necessary for the sense amplifier to output correct data. To correctly output data of a memory cell, the sense amplifier has to wait to perform operation of amplifying a potential difference (signal difference) between paired bit lines until the potential difference increases to the offset voltage or higher. Consequently, when the offset voltage is high, the operation speed of the sense amplifier decreases, and reading operation of the semiconductor memory device becomes slow. The operation speed of the semiconductor memory device depends on not only the operation speed of the memory cell but also the operation speed of the sense amplifier.

To address the problem, a method of trimming the offset voltage of the sense amplifier is considered. A conventional sense amplifier has two trimming transistors provided between two current paths, which are corresponding to each of paired bit lines or each of paired sense nodes, and a power supply, and two latch circuits for turning on/off the trimming transistors. To reduce variations in the offset voltage, the latch circuits turn on one of the two trimming transistors and turn off the other trimming transistor, thereby adjusting amounts of current flowing through the two current paths. The trimming amount of the offset voltage is a predetermined value determined by the size (W/L) of a trimming transistor, that is, current drivability.

However, when such a trimming method is employed, although variations in the offset voltage are reduced the offset voltage of sense amplifiers around an expectation value (offset voltage=0) is also trimmed, so that the number of offset voltages of the sense amplifiers existing at ends of a distribution of the offset voltage increases as shown in FIG. 5. Further, since there are also variations among the trimming transistors, a distribution of the offset voltages is widened in such a manner that both ends of the distribution are elongated.

In addition, in the conventional semiconductor memory device, to maintain symmetry of a sense amplifier, a trimming transistor, a latch circuit, a buffer circuit, and the like have to be provided for each of two sense nodes. It causes a problem such that the size of the semiconductor memory device as a whole becomes large.

SUMMARY OF THE INVENTION

A semiconductor integrated circuit device according to an embodiment of the present invention comprises two bit lines connected to a memory cell and making a pair; two input nodes making a pair; two sense nodes transmitting a signal difference input to the two input nodes and transmitting an amplified signal according to a signal difference between the two bit lines; an output node outputting the amplified signal from one of the two sense nodes; at least one current adjustment gate adjusting an amount of current flowing through at least one of the two sense nodes; at least one latch circuit controlling the current adjustment gate; two signal lines transmitting a power source voltage and a comparison voltage via the two input nodes respectively, the comparison voltage being obtained by subtracting an absolute value of a predetermined threshold voltage from an absolute value of the power source voltage; and two switching elements provided between the two input nodes and the two signal lines, respectively, wherein the latch circuit switches the current adjustment gate in the case where the amplified signal is an inversion signal of an amplified signal according to the threshold voltage when the power source voltage and the comparison voltage are respectively applied to the two input nodes.

A semiconductor integrated circuit device according to an embodiment of the present invention comprises two bit lines connected to a memory cell and making a pair; two input nodes making a pair; two sense nodes transmitting a signal difference input to the two input nodes and transmitting an amplified signal according to a signal difference between the two bit lines; an output node outputting the amplified signal from one of the two sense nodes; at least one current adjustment gate adjusting an amount of current flowing through at least one of the two sense nodes; at least one latch circuit controlling the current adjustment gate; two signal lines transmitting a power source voltage and a comparison voltage via the two input nodes respectively, the comparison voltage being obtained by subtracting an absolute value of a predetermined threshold voltage from an absolute value of the power source voltage; and two switching elements provided between the two input nodes and the two signal lines, respectively, wherein the latch circuit switches the current adjustment gate when the absolute value of an offset voltage is larger than the threshold voltage, the offset voltage being the minimum potential difference between the two input nodes necessary to output accurate data.

A trimming method of a semiconductor integrated circuit device according to an embodiment of the present invention, the semiconductor integrated circuit device comprising two bit lines connected to a memory cell and making a pair; tow input nodes making a pair; two sense nodes transmitting a signal difference input to the two input nodes or an amplified signal according to a signal difference between the two bit lines; an output node outputting the amplified signal from one of the two sense nodes; at least one current adjustment gate adjusting an amount of current flowing through each of the two sense nodes; at least one latch circuit controlling the current adjustment gate; two signal lines transmitting a power source voltage and a comparison voltage via the two input nodes respectively, the comparison voltage being obtained by subtracting a predetermined threshold voltage from the absolute value of the power source voltage; and two switching elements provided between the two input nodes or the two sense nodes and the two signal lines, respectively, the method comprises applying the power source voltage and the comparison voltage to the two input nodes; and switching the current adjustment gate by the latch circuit in the case where the amplified signal is an inversion signal of a signal according to the threshold voltage.

DETAILED DESCRIPTION OF THE INVENTION

Embodiments of the present invention will be described below referring to drawings. The embodiments do not limit the present invention. In the following embodiments, a sense amplifier and its periphery provided on the inside of an SRAM, as an example of a semiconductor integrated circuit device, will be described.

First Embodiment

Figure 1:
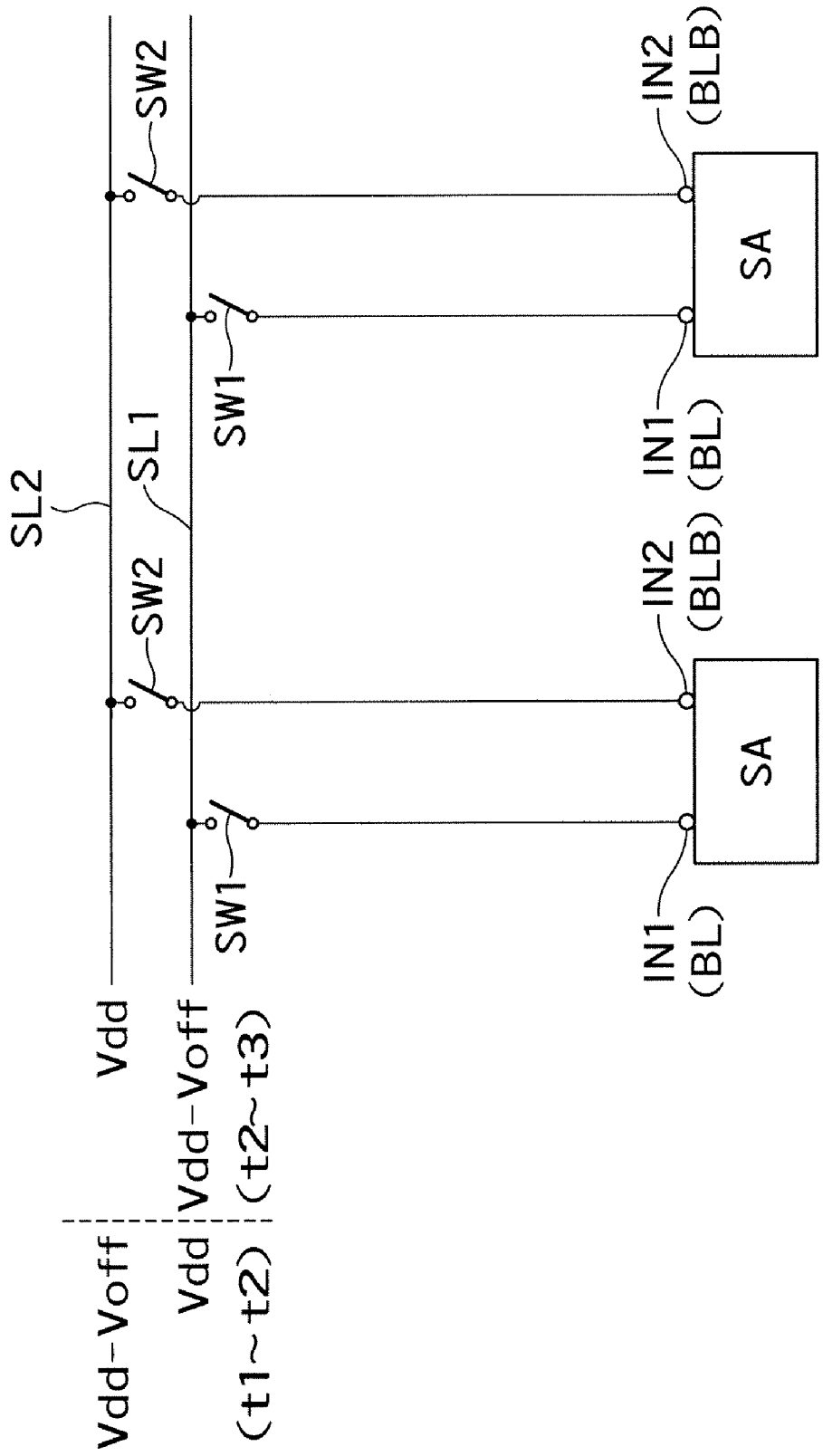
FIG. 1 is a schematic diagram showing sense amplifiers SA and their periphery according to a first embodiment of the present invention.

FIG. 1 is a schematic diagram showing sense amplifiers SA and their periphery according to a first embodiment of the present invention. Although two sense amplifiers SA are shown in FIG. 1, more of sense amplifiers SA may be provided in practice.

A sense amplifier SA has a pair of input nodes IN1 and IN2. Signal lines SL1 and SL2 are provided in correspondence with the input nodes IN1 and IN2, respectively. A switching element SW1 is connected between the signal line SL1 and the input node IN1, and a switching element SW2 is connected between the signal line SL2 and the input node IN2. The switching elements SW1 and SW2 may be, for example, MOSFETs.

One of the signal lines SL1 and SL2 transmits a power source voltage Vdd generated to be used in the SRAM, and the other signal line transmits a comparison voltage (Vdd−Voff) obtained by subtracting a predetermined voltage Voff from the power source voltage Vdd. The voltage Voff is a threshold voltage which is preset for determining the sense amplifier SA to be trimmed on the basis of the offset voltage of the sense amplifier SA.

Figure 2:
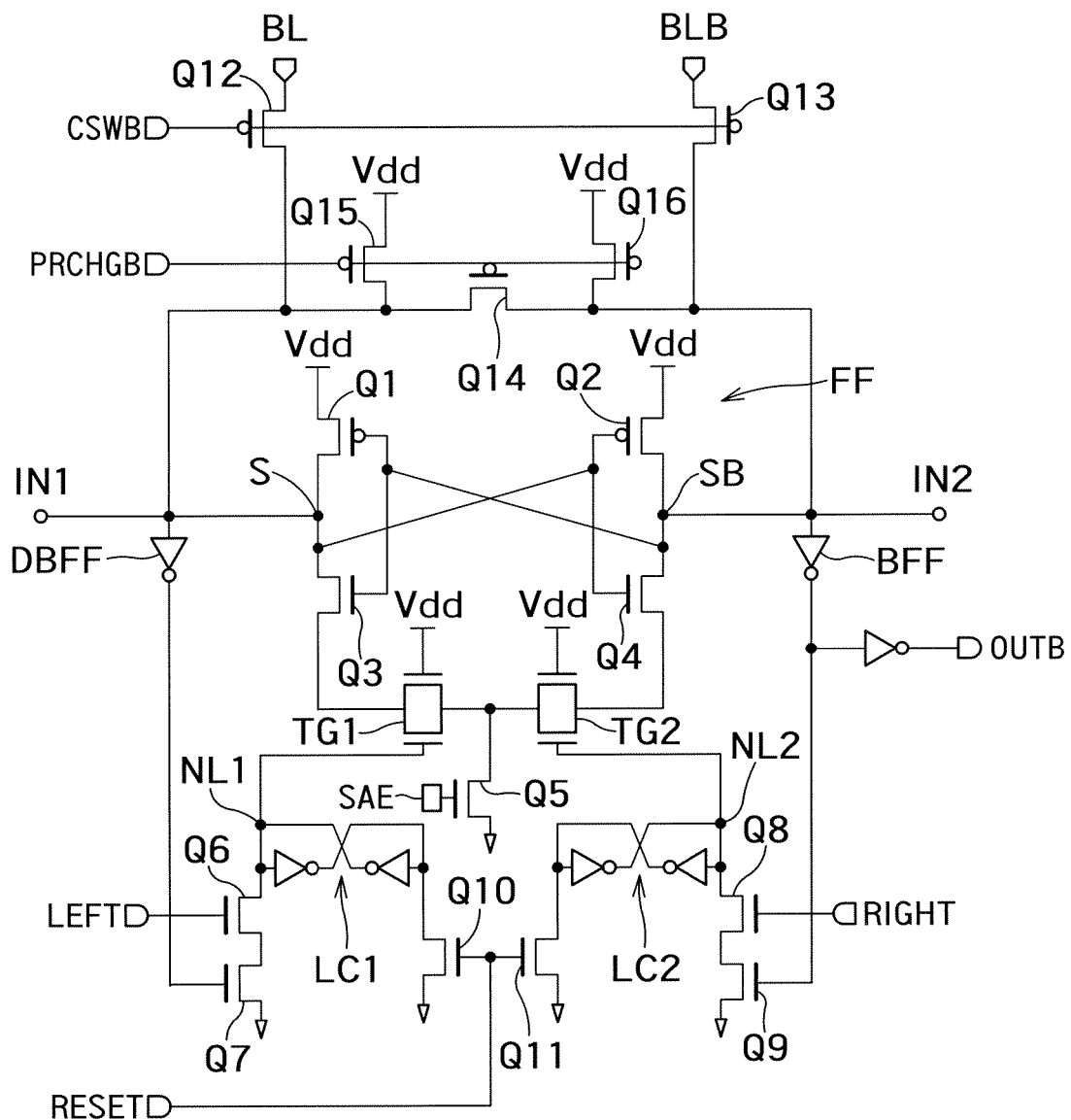
FIG. 2 is a circuit diagram showing an internal configuration of a sense amplifier SA.

FIG. 2 is a circuit diagram showing an internal configuration of a sense amplifier SA. The sense amplifier SA includes two sense nodes S and SB for transmitting an amplified signal based on the difference between input signals received at the input nodes IN1 and IN2, an output node OUTB for outputting the amplified signal from the sense node SB, transfer gates TG1 and TG2 as two current adjustment gates for adjusting amounts of currents flowing through the two sense nodes S and SB respectively, and two latch circuits LC1 and LC2 for on/off controlling the transfer gates TG1 and TG2.

Although the input nodes IN1 and IN2 are connected to the sense nodes S and SB in the embodiment, they may be connected to the sense nodes S and SB via bit lines BL and BLB.

The sense amplifier SA further includes a flip flop FF including a PMOS transistor Q1 and an NMOS transistor Q3 connected in series at the sense node S and a PMOS transistor Q2 and an NMOS transistor Q4 connected in series at the sense node SB. The drains of the transistors Q1 and Q2 are connected to the power source voltage Vdd. The sources of the transistors Q3 and Q4 are connected to the ground via the transfer gates TG1 and TG2, respectively, and an NMOS transistor Q5. The transistor Q5 allows the sense amplifier SA to start operating by connecting the sources of the transistors Q3 and Q4 to the ground.

The transfer gates TG1 and TG2 are gates to which a plurality of NMOS transistors are connected in parallel, respectively. One of gates of the transfer gate TG1 is connected to a node NL1 at one end of the latch circuit LC1 and is connected to the ground via NMOS transistors Q6 and Q7. The other gate of the transfer gate TG1 is connected to the power source voltage Vdd. One of gates of the transfer gate TG2 is connected to a node NL2 at one end of the latch circuit LC2 and is connected to the ground via NMOS transistors Q8 and Q9. The other gate of the transfer gate TG2 is connected to the power source voltage Vdd. The other end of the latch circuit LC1 is connected to the ground via an NMOS transistor Q10, and the other end of the latch circuit LC2 is connected to the ground via an NMOS transistor Q11.

The sense nodes S and SB are connected to the gates of the transistors Q7 and Q9 via a dummy buffer DBFF and a buffer BFF, respectively. The sense nodes S and SB are connected to the bit lines BL and BLB via PMOS transistors Q12 and Q13 as column switching elements, respectively. The sense nodes S and SB are connected to each other via a PMOS transistor Q14 as a short transistor. Further, the sense nodes S and SB are connected to the power source voltage Vdd via PMOS transistors Q15 and Q16 as precharge transistors, respectively.

The gates of the transistors Q1 and Q3 constructing the flip flop FF are commonly connected to the sense node SB, and the gates of the transistors Q2 and Q4 are commonly connected to the sense node S. That is, the gates of the transistors Q1 and Q3 and the gates of the transistors Q2 and Q4 are cross-coupled.

The transistor Q5 is controlled by a sense amplifier enable signal SAE which is driven when the sense amplifier SA operates. The transistor Q6 is controlled by a measurement/drive signal LEFT which is driven when the offset voltage of the sense amplifier SA is measured and corrected. The transistor Q8 is controlled by a measurement/drive signal RIGHT which is driven when the offset voltage of the sense amplifier SA is measured and corrected.

The transistors Q12 and Q13 are controlled by a column switching signal CSWB which is driven when data of a memory cell (not shown) is read. The transistors Q14 to Q16 are controlled by a precharge signal PRCHGB which is driven at the time of a precharge operation.

Figure 3:
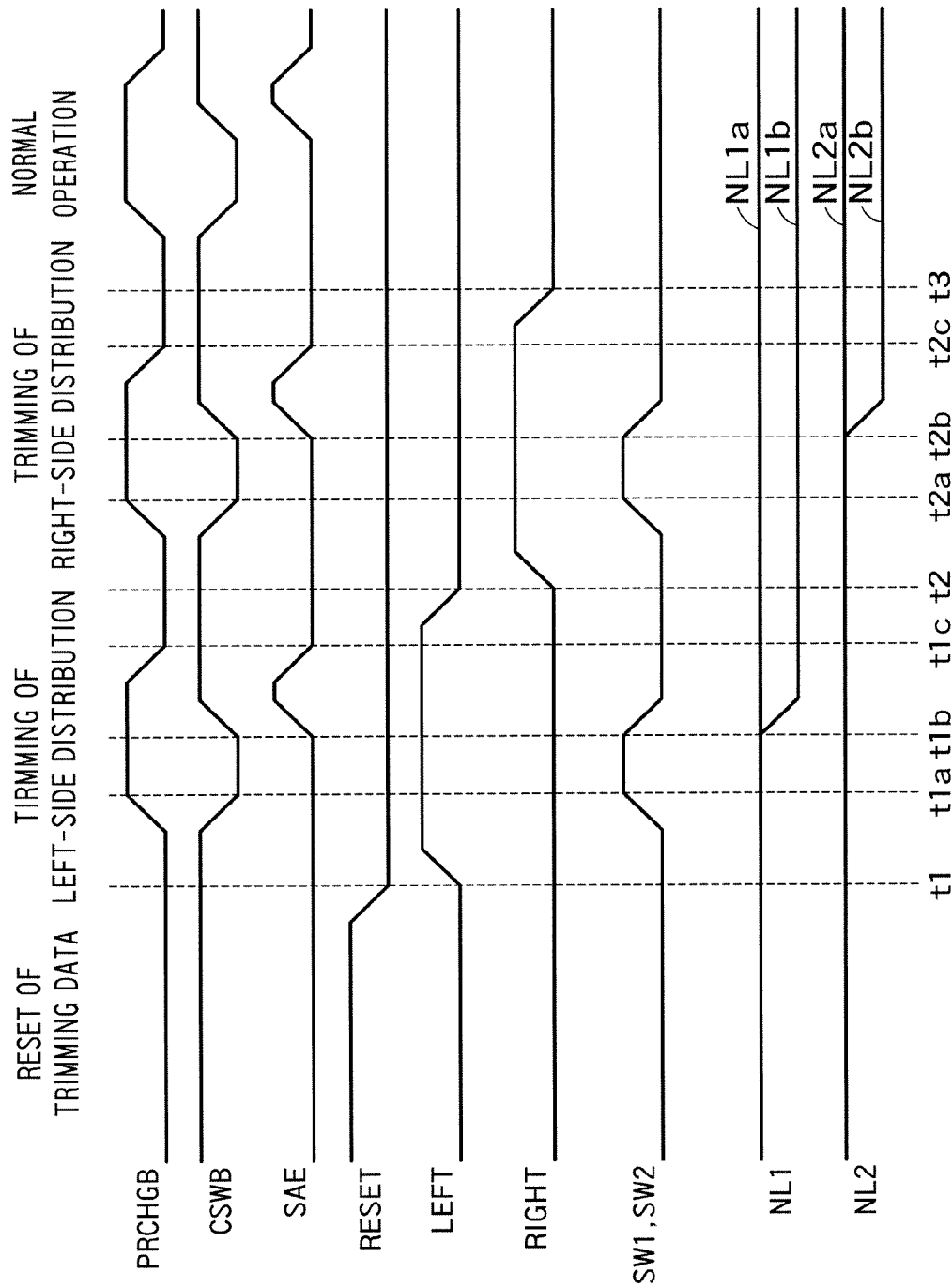
FIG. 3 is a timing chart showing operations of the sense amplifier SA and its periphery.
Figure 4:
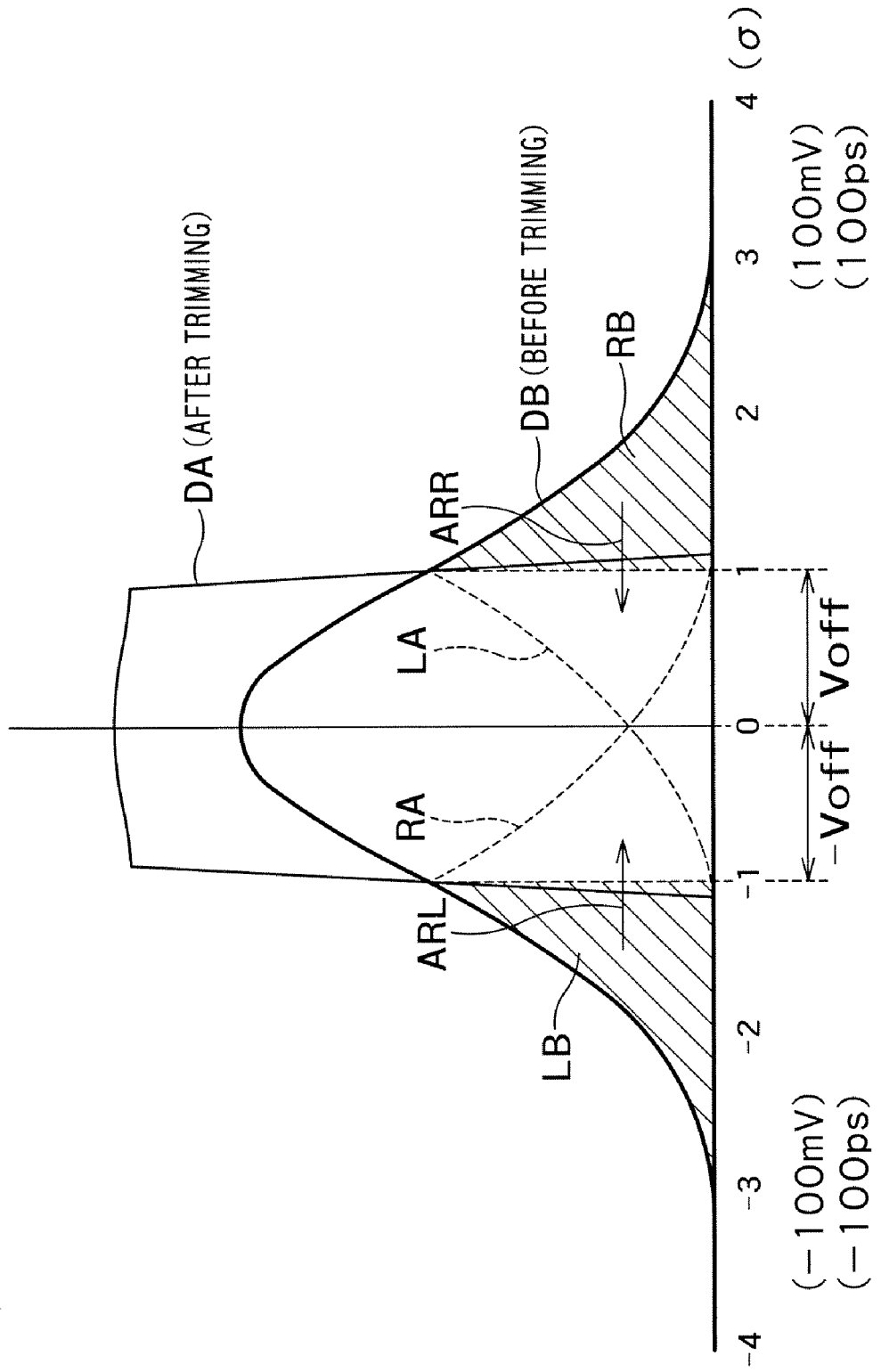
FIG. 4 is a graph showing a distribution DB of the offset voltage before trimming and a distribution DA of the offset voltage after trimming.

With reference to FIGS. 3 and 4, the operation of the semiconductor memory device according to the embodiment will be described. FIG. 3 is a timing chart showing operations of the sense amplifiers SA and peripheries thereof. Trimming information regarding to the offset voltages is reset before normal operation of the SRAM (until t1) and latched at the same time as measurement of the offset voltages (t1 to t2). FIG. 4 is a graph showing a distribution DB of the offset voltages before trimming and a distribution DA of the offset voltages after trimming. The axis of ordinate shows the number of the sense amplifiers SA, and the axis of abscissa shows standard deviation σ and the offset voltages. The causes of generation of the offset voltages are variations in the threshold voltages of transistors, variations in wiring resistances in the sense amplifiers, variations in parasitic capacities in elements constructing the sense amplifiers or in wires, asymmetry of the layout of the sense amplifiers, and the like.

First, as shown in FIG. 3, trimming data is reset (until t1). The trimming data resetting operation is an operation of resetting the latch circuits LC1 and LC2 to an initial state by activating a reset signal RESET to the HIGH level. In the embodiment, the nodes NL1 and NL2 of the latch circuits LC1 and LC2 are activated to the HIGH level by the resetting operation. That is, in the initial state, the transfer gates TG1 and TG2 are in the on state.

A signal in an active state is a signal for activating an element. Therefore, in the case of driving an NMOS transistor, a HIGH level (high potential level) signal is an activating signal. In the case of driving a PMOS transistor, a low (low potential level) signal is an activating signal. An inactivating signal is an inversion signal of the activating signal.

During the resetting operation, a precharge signal PRCHGB is activated to the LOW level, so that the sense nodes S and SB are short-circuited to each other and equalized to the power source voltage Vdd. Since a column switching signal CSWB is in an inactive state at the HIGH level, the bit lines BL and BLB are disconnected from the sense nodes S and SB. Since the sense amplifier enable signal SAE is also in the inactive state, the flip flop FF is not operating. Further, the switching elements SW1 and SW2 shown in FIG. 1 are in an off state.

Next, in the period from t1 to t2, the offset voltages of the sense amplifiers SA before trimming shown in FIG. 4 are measured, and the offset voltages of the sense amplifiers SA in a left-side hatched portion LB in the distribution DB are trimmed. In the following, the trimming operation in the period from t1 to t2 will be called a trimming of the left-side distribution. The following trimming operation is explained regarding one of the sense amplifiers SA to be trimmed, for simplicity.

In the trimming of the left-side distribution, the reset signal RESET is made inactive to disconnect the latch circuits LC1 and LC2 from the ground. After that, the signal LEFT is made active, and the transistor Q6 is turned on. At this time, the transistor Q7 is in the off state, so that the latch circuit LC1 holds the initial state. It is assumed that the sense amplifier SA on the left side of σ=0 of the distribution DB of FIG. 4 has tendency that when the same voltage is applied to the input nodes IN1 and IN2, the sense node S is latched at a potential higher than SB. The sense amplifier SA on the right side of σ=0 of the distribution DB has tendency that the sense node S is latched to a potential higher than SB when the same voltage is applied to the input nodes IN1 and IN2.

When the signal PRECHGB becomes inactive at t1a, precharging of the sense nodes S and SB is finished, and the sense nodes S and SB are electrically separated from each other. At this time, the switching elements SW1 and SW2 are turned on. The input nodes IN1 and IN2 are connected to the signal lines SL1 and SL2 shown in FIG. 1, respectively, so that the power source voltage Vdd and the comparison voltage (Vdd−Voff) are transmitted to the input nodes IN1 and IN2, respectively.

At t1b, the signal CSWB is inactivated to the HIGH level, thereby turning off the switching elements SW1 and SW2. After that, by activating the sense amplifier enable signal SAE, the flip flop FF amplifies the signals of the sense nodes S and SB. At t1a, potential at the input node IN1 is higher than the potential at the input node IN2 by the amount of Voff. Consequently, when the absolute value of the offset voltage of the sense amplifier SA is smaller than that of the voltage Voff, the flip flop FF normally amplifies the signals of the sense nodes S and SB. Therefore, the output node OUTB outputs a correct signal LOW (data "0") according to the potential difference (Voff) of the two input nodes. That is, the flip flop FF amplifies those potentials while holding the relation that the potential of the sense node S is higher than that of the sense node SB. Since the transistor Q7 holds the off state at this time, the state of the node NL1 of the latch circuit LC1 has been unchanged from the initial state as shown by NL1a in FIG. 3. That is, the sense amplifier SA whose absolute value of the offset voltage is smaller than the absolute value of the voltage Voff is not trimmed.

On the other hand, when the absolute value of the offset voltage of the sense amplifier SA is higher than that of the threshold voltage Voff, there is a case that the flip flop FF does not normally amplify signals of the sense nodes S and SB. For example, at this time, if the offset voltage makes the potential of the sense node S drop largely below the threshold voltage Voff, the potential relation between the sense nodes S and SB is reversed, so that the flip flop FF erroneously amplifies each of the potentials of the sense nodes S and SB. In this case, the potential of the sense node SB changes from the HIGH level to the LOW level, so that the transistor Q7 is turned on, and the state of the node NL1 of the latch circuit LC1 switches from the initial state as shown by NL1b in FIG. 3. Accordingly, one of the gates of the transfer gate TG1 becomes the LOW level, so that the size (W (gate width)/L (gate length)) (current drivability) of the transfer gate TG1 decreases. When the size (W/L) (current drivability) of the transfer gate TG1 decreases, the potential of the sense node S increases. That is, by the trimming, the output node OUTB can output the correct signal LOW (data "0"). In such a manner, the sense amplifier SA having an offset voltage whose absolute value is larger than the threshold voltage Voff is trimmed. By the trimming of the left-side distribution, the sense amplifiers SA in the left-side hatched portion LB in FIG. 4 are corrected in the direction of an arrow ARL. In the trimming of the left-side distribution, however, the sense amplifiers SA in the right-side hatched portion RB cannot be corrected.

After that, in a period from t2 to t3, the offset voltages of the sense amplifiers SA in the right-side hatched portion RB in FIG. 4 are trimmed. The trimming operation in the period from t2 to t3 will be called trimming of the right-side distribution. The following trimming operation is explained regarding one of the sense amplifiers SA to be trimmed, for simplicity.

In the trimming of the right-side distribution, the potential relation of the signal lines SL1 and SL2 in FIG. 1 is reversed.

Specifically, the signal line SL1 transmits the comparison voltage (Vdd−Voff), and the signal line SL2 transmits the power source voltage Vdd.

At t2, a signal RIGHT is made active, thereby turning on the transistor Q8. Since the transistor Q9 is in the off state at this time, the latch circuit LC2 holds the initial state.

At t2a, by making the signal PRECHGB inactive, precharge of the sense nodes S and SB is finished, and the sense nodes S and SB are electrically separated from each other. At this time, the switching elements SW1 and SW2 are turned on. The input nodes IN1 and IN2 are connected to the signal lines SL1 and SL2, respectively, and the comparison voltage (Vdd−Voff) and the power source voltage Vdd are transmitted to the input nodes IN1 and IN2, respectively. The relation of voltages applied to the input nodes IN1 and IN2 is opposite to that at the time of trimming of the left-side distribution.

At t2b, the signal CSWB is inactivated to the HIGH level, thereby turning off the switching elements SW1 and SW2. After that, by activating the sense amplifier enable signal SAE, the flip flop FF amplifies the signals of the sense nodes S and SB. In the case where the absolute value of the offset voltage of the sense amplifier SA is smaller than that of the voltage Voff, the flip flop FF normally amplifies the signals of the sense nodes S and SB. Therefore, the output node OUTB outputs a correct signal HIGH (data "1") according to the potential difference (Voff) of the two input nodes. Since the transistor Q9 holds the off state, the state of the node NL2 of the latch circuit LC2 does not change from the initial state as shown by NL2a in FIG. 3. That is, the sense amplifier SA whose absolute value of the offset voltage is smaller than the absolute value of the voltage Voff is not trimmed.

On the other hand, when the absolute value of the offset voltage of the sense amplifier SA is higher than that of the threshold voltage Voff, there is a case that the flip flop FF does not normally amplify signals of the sense nodes S and SB. For example, in the case where the offset voltage makes the potential of the sense node SB drop largely below the threshold voltage Voff, the potential relation between the sense nodes S and SB is reversed, so that the flip flop FF erroneously amplifies each of the potentials of the sense nodes S and SB. In this case, the potential of the sense node S changes from the HIGH level to the LOW level, so that the transistor Q9 is turned on, and the state of the node NL2 of the latch circuit LC2 switches from the initial state as shown by NL2b in FIG. 3. Accordingly, one of the gates of the transfer gate TG2 becomes the LOW level, so that the size (W/L) (current drivability) of the transfer gate TG2 decreases. When the size (W/L) (current drivability) of the transfer gate TG2 decreases, the potential of the sense node SB increases. That is, by the trimming, the output node OUTB can output the correct signal HIGH (data "1"). In such a manner, the sense amplifier SA having an offset voltage whose absolute value is larger than the threshold voltage Voff is subjected to the trimming. By the trimming, the sense amplifiers SA in the right-side hatched portion RB in FIG. 4 are corrected in the direction of an arrow ARR.

As described above, in the embodiment, only the sense amplifiers SA whose offset voltages are equal to or higher than the threshold voltage Voff are selectively trimmed. That is, the voltage Voff is used as the threshold voltage for determining the sense amplifiers SA to be trimmed on the basis of the offset voltages of the sense amplifiers SA.

The trimming amount, that is, a voltage to be corrected in a trimming operation can be determined according to the size ratio (current drivability ratio) of the NMOS transistors connected in parallel at each of the transfer gates TG1 and TG2. The size ratio of the transfer gates TG1 and TG2 can be arbitrarily set.

At t3 or later, the semiconductor memory device executes normal operation. At t3 or later, the latch circuits LC1 and LC2 hold the same state as of the state at the trimming, so that the sense amplifier SA can operate in a state where the offset voltage is corrected. Consequently, the switching elements SW1 and SW2 and the signal lines SL1 and SL2 are used only at the time of trimming and become unnecessary in the following normal operation.

As an illustrative example, as shown in FIG. 4, the range of variations of the offset voltage is set to ±3σ, and a voltage corresponding to ⅓ of the range, that is, ±σ is set as the threshold Voff. When the offset voltage corresponding to ±3σ (σ denotes standard deviation) is ±100 mV, the threshold voltage Voff is about 33 mV. In this case, a sense amplifier SA having an offset voltage whose absolute value is 33 mV or larger is a target of trimming.

In the trimming of the left-side distribution, the offset voltages of the sense amplifiers SA in the range of −1σ to −3σ in the hatched portion LB are corrected in the direction shown by an arrow ARL. When the trimming amount is ±2σ (±66 mV), the offset voltages of the sense amplifiers SA in the left-side hatched portion LB are corrected to a region LA shown by a broken line. By the trimming of the right-side distribution, the offset voltages of the sense amplifiers SA in the right-side hatched portion RB are corrected to a region RA shown by a broken line. As a result, variations in the offset voltage become almost ±σ. A distribution DA as a whole after the trimming corresponds to a simulation result. In the illustrative example, the variations in the offset voltages are reduced by ⅓ (from ±3σ to ±σ).

In the embodiment, at the time of trimming, the signal line SL1 transmits one of the power source voltage Vdd or the comparison voltage (Vdd−Voff) to the input node IN1 via the switching element SW1, and the signal line SL2 transmits another of the power source voltage Vdd or the comparison voltage (Vdd−Voff) to the input node IN2 via the switching element SW2. Consequently, only the offset voltages of the sense amplifier SAs having an offset voltages whose absolute values are equal to or higher than the threshold voltage Voff can be selectively trimmed. That is, without trimming the offset voltages of the sense amplifiers SA which do not need to be trimmed, only the offset voltages of the sense amplifiers SA necessary to be trimmed can be trimmed. As a result, variations in the offset voltages can be reduced as compared with those in the conventional technique, and higher speed in the operation of the semiconductor memory device can be realized.

In the embodiment, the invention can be carried out only by adding the signal lines SL1 and SL2 and the switching elements SW1 and SW2 to the conventional sense amplifier SA. Therefore, while suppressing increase in the size of the semiconductor memory device to the minimum, variations in the offset voltages can be reduced.

Figure 5:
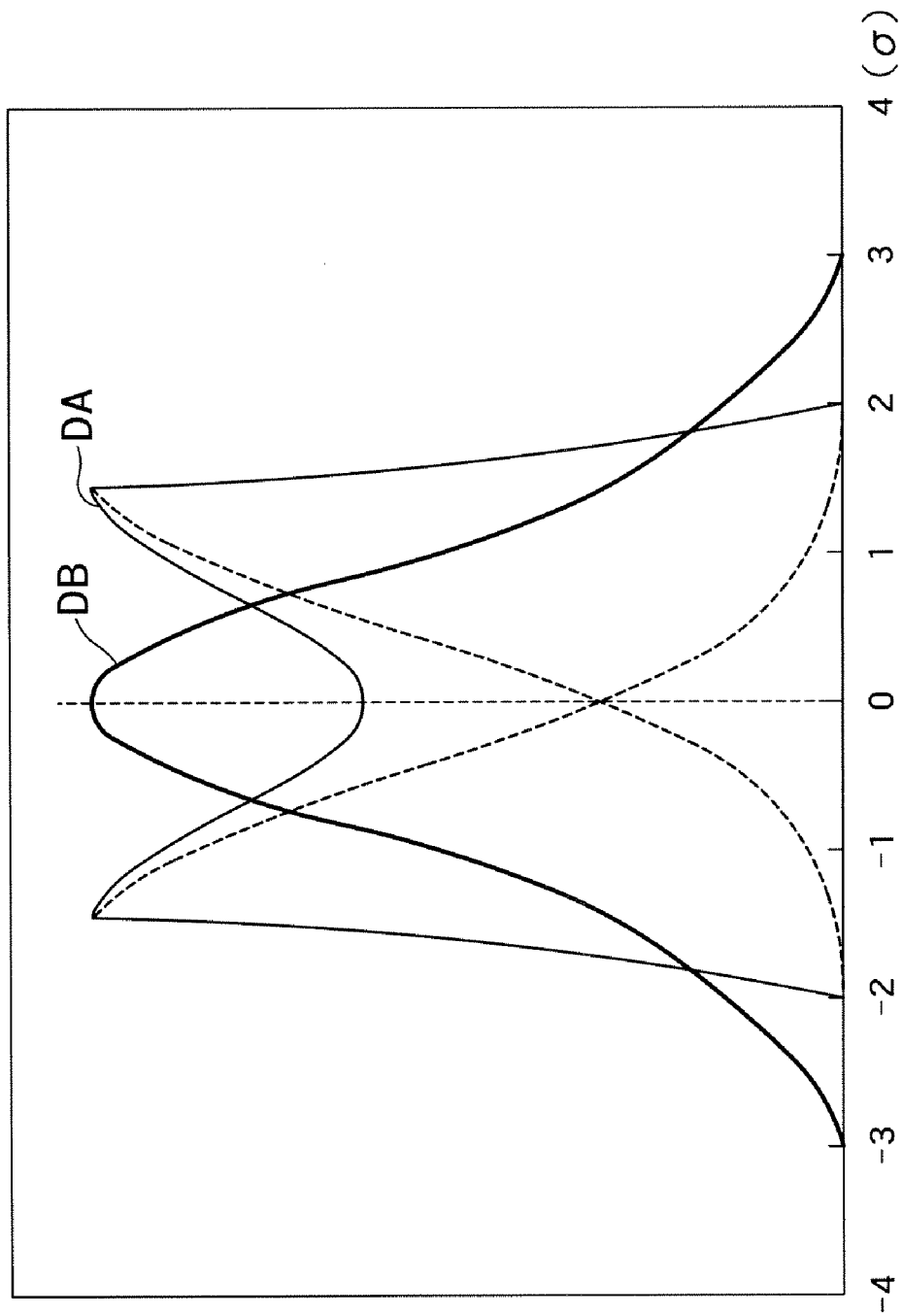
FIG. 5 shows a result of simulation when conventional 1-bit trimming is performed as a comparison example.

FIG. 5 shows a result of simulation when conventional 1-bit trimming is performed as a comparison example. In the 1-bit trimming, offset voltages of all of the sense amplifiers SA are trimmed to either the right or left side. A distribution DB of the offset voltages before trimming becomes a distribution DA by the trimming. In this case, the variations of the offset voltages are reduced only to the half. Moreover, the number of sense amplifiers SA whose offset voltages are in the center (σ=0) of the distribution DA is small, and the number of sense amplifiers SA whose offset voltages are at ends (σ=1.5 to 2) of the distribution DA is relatively large.

Since the offset voltages of the sense amplifiers SA at ends of the distribution DA vary more or less even after trimming, a distribution is not preferable.

In the embodiment, as described with reference to FIG. 4, variations in the offset voltage can be reduced comparing to the conventional technique and the number of sense amplifiers SA whose offset voltages are in the center ($\sigma=0$) of the distribution DA is relatively large, so that the distribution is preferable.

In the trimming of the left-side distribution and the trimming of the right-side distribution, the relation of the power source voltage Vdd and the comparison voltage (Vdd−Voff) applied to the signal lines SL1 and SL2 may be reversed.

Second Embodiment

Figure 6:
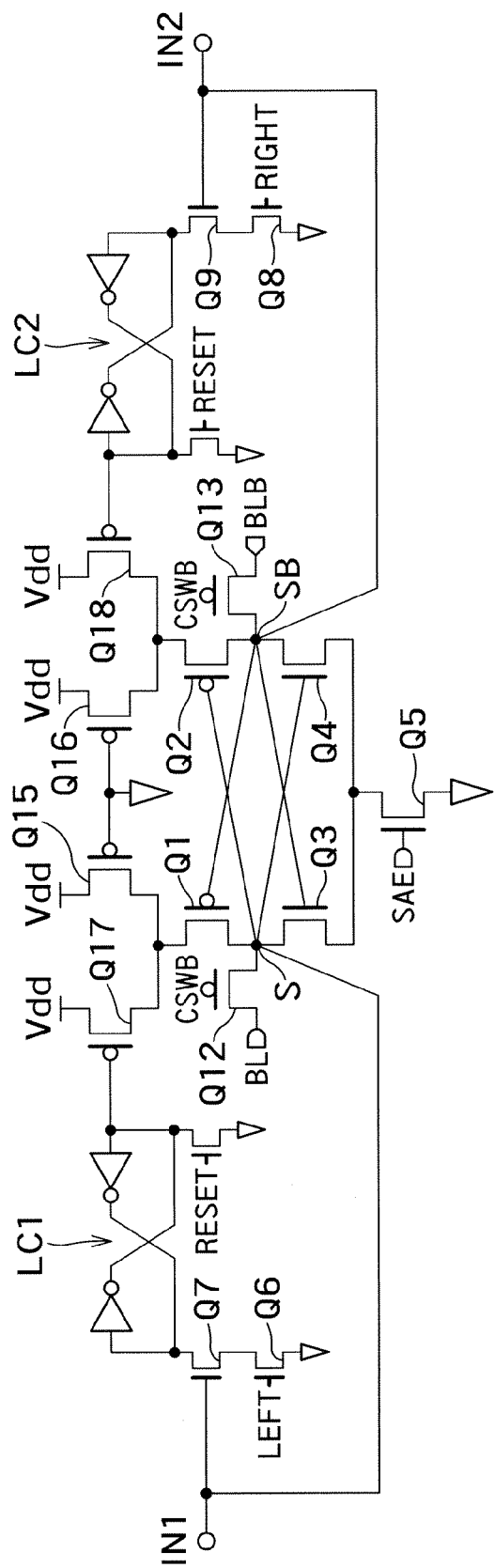
FIG. 6 is a circuit diagram showing an internal configuration of a sense amplifier SA of a second embodiment according to the present invention.

FIG. 6 is a circuit diagram showing an internal configuration of a sense amplifier SA of a second embodiment according to the present invention. A semiconductor memory device of the second embodiment is realized by applying the configuration shown in FIG. 6 to the sense amplifier SA shown in FIG. 1. In FIG. 6, the same reference numerals are designated to the same components as those of FIG. 2.

The sense amplifier SA of the second embodiment has, in place of the transfer gates TG1 and TG2 in the first embodiment, a PMOS transistor Q17 connected in parallel with the transistor Q15 between the power source voltage Vdd and the transistor Q1, and a PMOS transistor Q18 connected in parallel with the transistor Q16 between the power source voltage Vdd and the transistor Q2. The other configuration of the second embodiment may be the same as that of the first embodiment.

The transistors Q17 and Q18 function as current adjustment gates in a manner similar to the transfer gates TG1 and TG2 of the first embodiment. In the first embodiment, the transfer gates TG1, provided between the transistor Q3 and the transistor Q5, and TG2, provided between the transistor Q4 and Q5 adjust amounts of current flowing through the sense nodes S and SB. In the second embodiment, the transistors Q17, provided between the power source voltage Vdd and the sense node S, and Q18, provided between the power source voltage Vdd and the sense node SB, adjust the current amounts. The other operation of the semiconductor memory device according to the second embodiment is the same as the other operation of the semiconductor memory device of the first embodiment. The second embodiment can obtain effects similar to those of the first embodiment.

Third Embodiment

Figure 7:
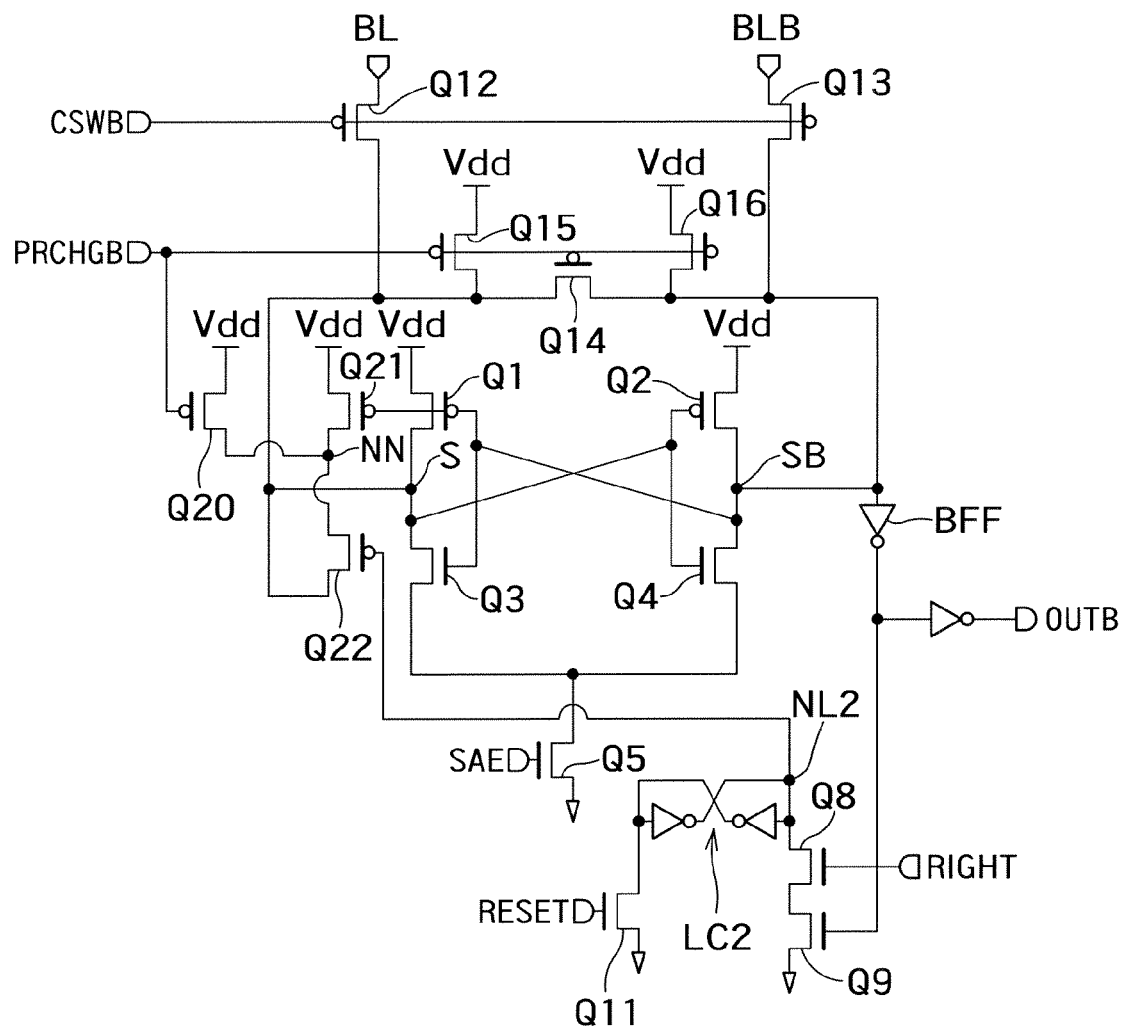
FIG. 7 is a circuit diagram showing an internal configuration of a sense amplifier SA of a third embodiment according to the present invention.

FIG. 7 is a circuit diagram showing an internal configuration of a sense amplifier SA of a third embodiment according to the present invention. A semiconductor memory device of the third embodiment may be realized by applying the configuration shown in FIG. 7 to the sense amplifier SA shown in FIG. 1. In FIG. 7, the same reference numerals are designated to the same components as those of FIG. 2.

The sense amplifier SA of the third embodiment does not have the dummy buffer DBFF, the latch circuit LC1, the transfer gates TG1 and TG2, and the transistors Q6, Q7, and Q10 of the first embodiment. On the other hand, the sense amplifier SA includes PMOS transistors Q21 to Q23.

The transistors Q21 and Q22 are connected in series between the power source voltage Vdd and the sense node S. The gate of the transistor Q21 is common to the gate of the transistor Q1. The gate of the transistor Q22 is connected to the node NL2 of the latch circuit LC2. A transistor Q20 is connected in parallel with the transistor Q21 between the power source voltage Vdd and the transistor Q22. The gate of the transistor Q20 is connected to the precharge signal PRECHGB.

The transistor Q20 is provided to equalize a node NN, between the transistors Q21 and Q22, to Vdd at the time of precharging. The transistor Q21 operates in a manner similar to the transistor Q1. The transistor Q22 is turned on when the latch circuit LC2 switches from the initial state, to adjust the amount of current flowing through the sense node S. That is, the transistor Q22 functions as a current adjustment gate.

Normally, as an output signal, either the signal of the sense node S or the signal of the sense node SB is output from the output node. In the embodiment, the output signal is output from the output node OUTB from the sense node SB via the buffer BFF. Therefore, the signal of the sense node S is not originally used. However, if parasitic capacities of elements connected to the sense nodes S and SB are not equalized, an offset voltage increases. To address the problem, the sense amplifier SA is constructed symmetrically with respect to the sense nodes by providing the dummy buffer DBFF and the like.

In the third embodiment, by eliminating an element (dummy buffer DBFF) provided to equalize the parasitic capacities regarding to the sense nodes S and SB, the offset voltage is intentionally increased. By the operation, it is sufficient to execute the trimming only in one direction of the distribution. Since one of the trimming of the left-side distribution and the trimming of the right-side distribution becomes unnecessary, elements (the latch circuit LC1, the transfer gates TG1 and TG2, and the transistors Q6, Q7, and Q10) used for the trimming which is not used are also unnecessary.

On the other hand, the PMOS transistors Q21 to Q23 are added to the sense amplifier SA. However, since the dummy buffer DBFF, the latch circuit LC1, the transfer gates TG1 and TG2, and the transistors Q6, Q7, and Q10 are not used, therefore the size of the semiconductor memory device as a whole is smaller.

Figure 8:
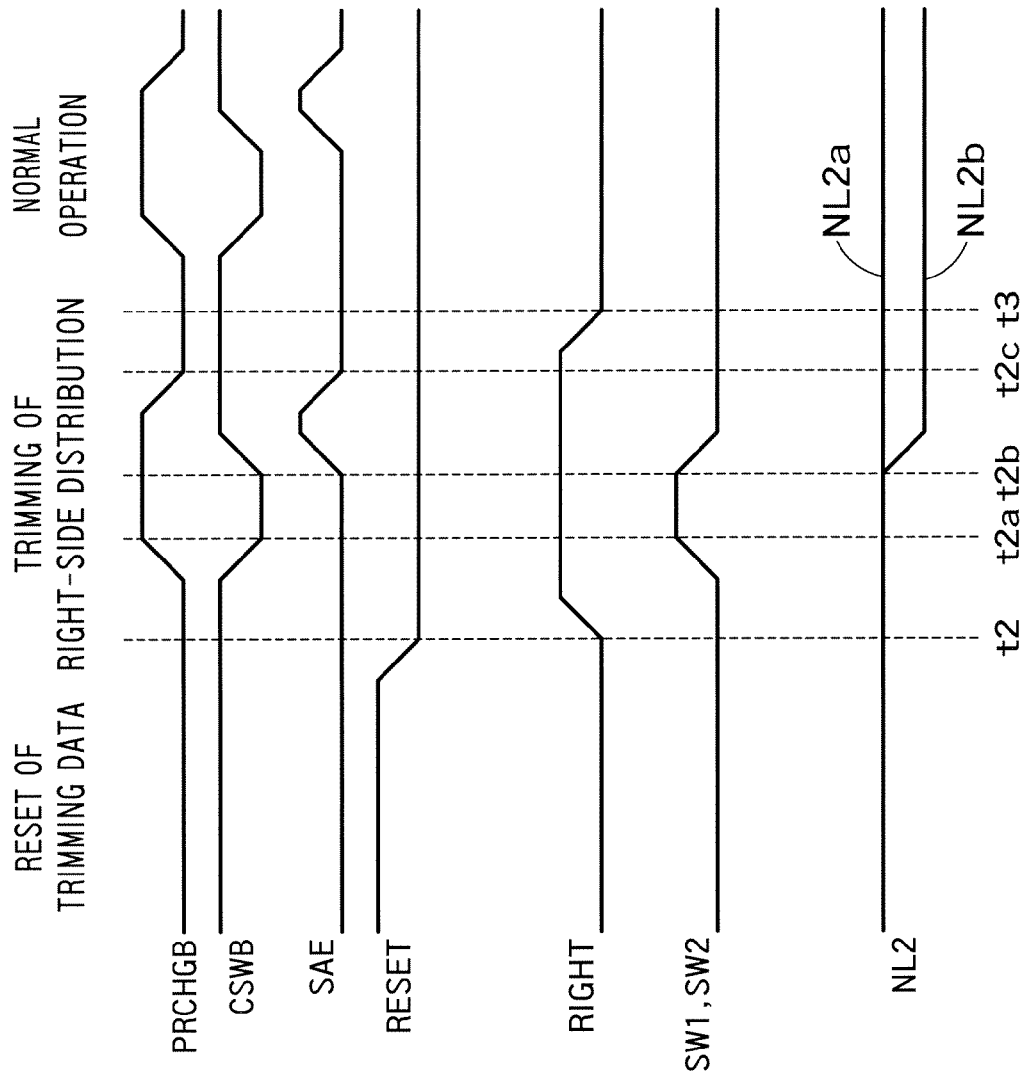
FIG. 8 is a timing chart showing operations of the semiconductor memory device according to the third embodiment.

FIG. 8 is a timing chart showing operations of the semiconductor memory device according to the third embodiment. The operations of the semiconductor memory device according to the third embodiment are basically similar to those of the semiconductor memory device according to the first embodiment. However, since the latch circuit LC1 and the node NL1 on the left side are not provided, the operations of the signals LEFT and NL1 among the signals shown in FIG. 3 are unnecessary. In the third embodiment, the offset voltage is intentionally increased to the right side as shown by the distribution DB in FIG. 9, so that only the trimming of the right-side distribution is executed, and it is unnecessary to execute the trimming of the left-side distribution. That is, in the third embodiment, it is sufficient to perform the trimming operation once.

Figure 9:
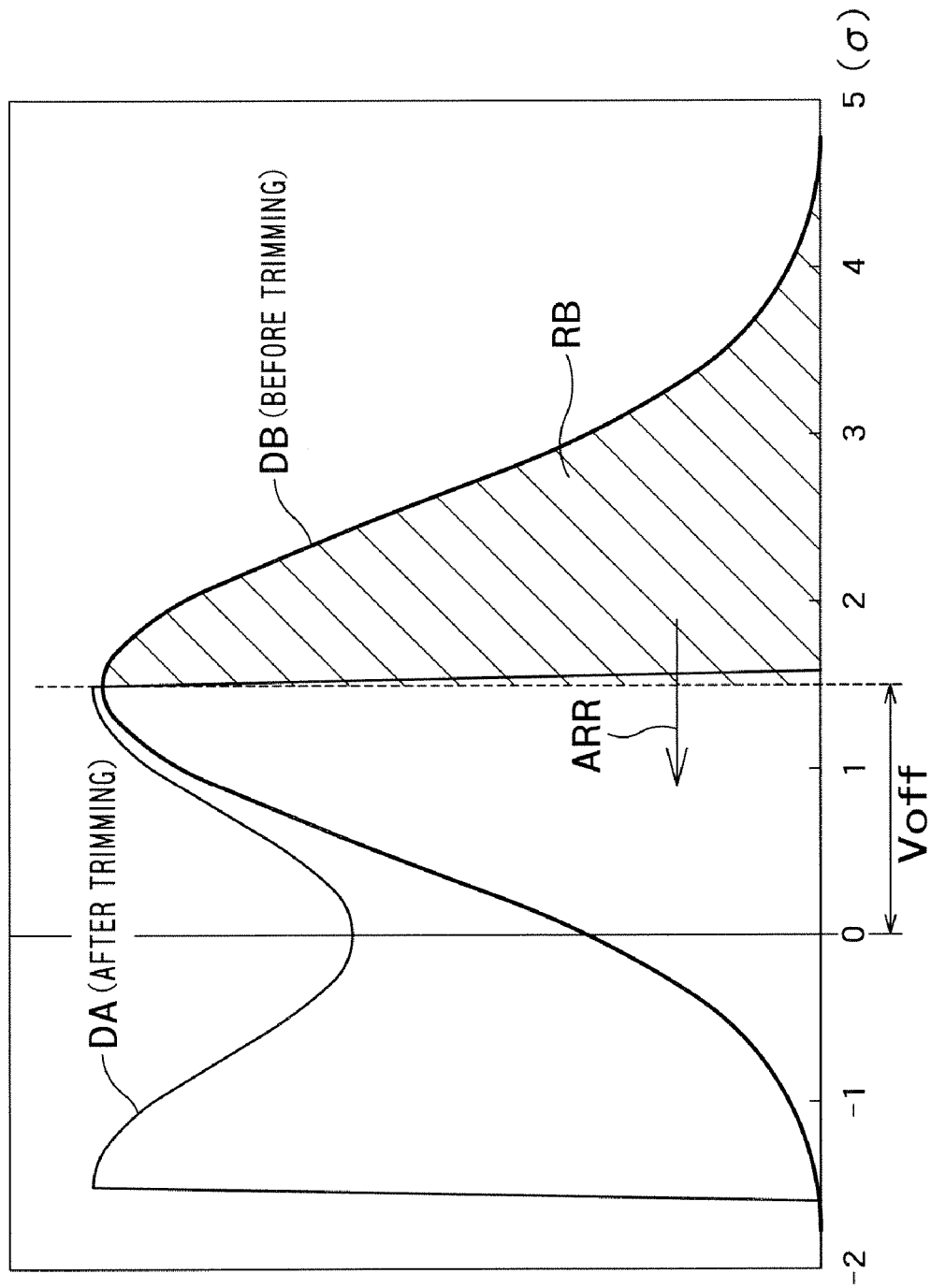
FIG. 9 is a graph showing the distribution DB of the offset voltage before trimming and the distribution DA of the offset voltage after the trimming in the third embodiment.

FIG. 9 is a graph showing the distribution DB of the offset voltage before trimming and the distribution DA of the offset voltage after the trimming in the third embodiment. The axis of ordinate shows the number of the sense amplifiers SA, and the axis of abscissa shows standard deviation σ and the offset voltage. With reference to FIGS. 8 and 9, the operation of the semiconductor memory device according to the third embodiment will be described more specifically.

Since the sense node SA does not have the dummy buffer DBFF, the latch circuit LC1, the transfer gates TG1 and TG2, and the transistors Q6, Q7, and Q10, the distribution DB before the trimming of the offset voltage shifts largely to the right side.

First, as shown in FIG. 8, trimming data is reset (until t1). Since the trimming data resetting operation is similar to that shown in FIG. 3, its description will not be repeated. Since the latch circuit LC1 is not provided, only the node NL2 of the latch circuit LC2 is reset to an initial state (HIGH level). In the initial state, the transistor Q22 is in the off state.

Since the precharge signal PRCHGB is activated to the LOW level during the resetting operation, the sense nodes S and SB and the node NN are equalized to the power source voltage Vdd.

Next, in t2 to t3, the offset voltage of the sense amplifier SA in a right-side hatched portion RB in FIG. 9 is trimmed. That is, the trimming of the right-side distribution is executed. In the trimming of the right-side distribution, the signal line SL1 transmits the comparison voltage (Vdd−Voff), and the signal line SL2 transmits the power source voltage Vdd.

At t2, the signal RIGHT is made active, thereby turning on the transistor Q8. Since the transistor Q9 is in the off state at this time, the latch circuit LC2 holds the initial state.

At t2a, by making the signal PRECHGB inactive, precharge of the sense nodes S and SB and the node NN is finished, and the sense nodes S and SB are electrically separated from each other. At this time, the switching elements SW1 and SW2 are turned on. The comparison voltage (Vdd−Voff) and the power source voltage Vdd are transmitted to the input nodes IN1 and IN2, respectively.

At t2b, the signal CSWB is inactivated to the HIGH level, thereby turning off the switching elements SW1 and SW2. After that, by activating the sense amplifier enable signal SAE, the flip flop FF amplifies the signals of the sense nodes S and SB. In the case where the absolute value of the offset voltage of the sense amplifier SA is smaller than that of the voltage Voff, the flip flop FF normally amplifies the signals of the sense nodes S and SB. Therefore, the output node OUTB outputs a correct signal HIGH (data "1") according to the potential difference (Voff) of the two input nodes. Since the transistor Q9 holds the off state, the state of the node NL2 of the latch circuit LC2 does not change from the initial state as shown by NL2a in FIG. 8. That is, the sense amplifier SA whose absolute value of the offset voltage is smaller than the absolute value of the voltage Voff is not trimmed.

On the other hand, when the absolute value of the offset voltage of the sense amplifier SA is higher than that of the threshold voltage Voff, there is a case that the flip flop FF does not normally amplify signals of the sense nodes S and SB. In this case, the potential of the sense node SB changes from the HIGH level to the LOW level, so that the transistor Q9 is turned on, and the state of the node NL2 of the latch circuit LC2 switches from the initial state as shown by NL2b in FIG. 8. Accordingly, one of the gates of the transfer gate TG2 becomes the LOW level, so that the transistor Q22 is turned on. The power source voltage Vdd is consequently connected to the sense node S via the transistors Q21 and Q22, thus the voltage of the sense node S rises. As described above, the sense amplifiers SA having an offset voltage larger than the threshold voltage Voff are trimmed. By the trimming, the offset voltages of the sense amplifiers SA in the right-side hatched portion RB in FIG. 9 are corrected in the direction of an arrow ARR.

The trimming amount, that is, a voltage to be corrected by trimming can be determined according to the size ratio (current drivability ratio) of the transistors Q21 and Q22. The size ratio of the transistors Q21 and Q22 can be arbitrarily set.

At t3 or later, the semiconductor memory device executes normal operation. At t3 or later, the latch circuit LC2 holds the state at the trimming, so that the sense amplifiers SA can operate in a state where the offset voltages are corrected. Consequently, the switching elements SW1 and SW2 and the signal lines SL1 and SL2 are used only at the time of trimming and become unnecessary in the following normal operation.

In the foregoing embodiments, the power source voltage Vdd and the comparison voltage (Vdd−Voff) may be applied from the outside of the semiconductor memory device. It is also possible to use, as the power source voltage Vdd, a power source voltage generated on the inside of the semiconductor memory device and provide a comparison voltage generating circuit on the inside of the semiconductor memory device to generate the comparison voltage (Vdd−Voff). However, the comparison voltage generating circuit is used during trimming but is unnecessary in the normal operation. Therefore, to reduce the size of the semiconductor memory device, the comparison voltage (Vdd−Voff) is preferably supplied from the outside.

In the foregoing embodiments, data is "1" when the output node OUTB outputs a signal of the HIGH level, and data is "0" when the output node OUTB outputs a signal of the LOW level. Alternatively, data may be "0" when the output node OUTB outputs a signal of the HIGH level, and data may be "1" when the output node OUTB outputs a signal of the LOW level.

The invention claimed is:

1. A semiconductor integrated circuit device comprising:
   two bit lines connected to a memory cell and making a pair;
   two input nodes making a pair;
   two sense nodes transmitting a signal difference input to the two input nodes and transmitting an amplified signal according to a signal difference between the two bit lines;
   an output node outputting the amplified signal from one of the two sense nodes;
   at least one current adjustment gate adjusting an amount of current flowing through at least one of the two sense nodes;
   at least one latch circuit controlling the current adjustment gate;
   two signal lines transmitting a power source voltage and a comparison voltage via the two input nodes respectively, the comparison voltage being obtained by subtracting an absolute value of a predetermined threshold voltage from an absolute value of the power source voltage; and
   two switching elements provided between the two input nodes and the two signal lines, respectively,
   wherein the latch circuit switches the current adjustment gate in the case where the amplified signal is an inversion signal of an amplified signal according to the threshold voltage when the power source voltage and the comparison voltage are respectively applied to the two input nodes.

2. The semiconductor integrated circuit device according to claim 1, wherein
   two current adjustment gates are provided in correspondence with the two sense nodes;
   two latch circuits are provided in correspondence with the two current adjustment gates, and
   in the case where the amplified signal is an inversion signal of a signal according to the threshold voltage when the power source voltage and the comparison voltage are applied to the two input nodes or the two sense nodes, one of the two latch circuits switches the current adjustment gate corresponding to the latch circuit.

3. The semiconductor integrated circuit device according to claim 1, wherein the latch circuit switches the current adjustment gate when the absolute value of an offset voltage is larger than the threshold voltage, the offset voltage being the minimum potential difference between the two input nodes necessary to output accurate data.

4. The semiconductor integrated circuit device according to claim 2, wherein the latch circuit switches the current adjustment gate when the absolute value of an offset voltage is larger than the threshold voltage, the offset voltage being the minimum potential difference between the two input nodes necessary to output accurate data.

5. The semiconductor integrated circuit device according to claim 1, wherein the current adjustment gate adjusts a current amount between the two sense nodes and a ground potential.

6. The semiconductor integrated circuit device according to claim 1, wherein the current adjustment gate adjusts a current amount between the two sense nodes and the power source voltage.

7. The semiconductor integrated circuit device according to claim 1, wherein the current adjustment gate is provided for one of the two sense nodes, the one of the two sense nodes being not provided with the output node.

8. The semiconductor integrated circuit device according to claim 2, wherein the current adjustment gate is provided for one of the two sense nodes, the one of the two sense nodes being not provided with the output node.

9. The semiconductor integrated circuit device according to claim 3, wherein the current adjustment gate is provided for one of the two sense nodes, the one of the two sense nodes being not provided with the output node.

10. A semiconductor integrated circuit device comprising:
two bit lines connected to a memory cell and making a pair;
two input nodes making a pair;
two sense nodes transmitting a signal difference input to the two input nodes and transmitting an amplified signal according to a signal difference between the two bit lines;
an output node outputting the amplified signal from one of the two sense nodes;
at least one current adjustment gate adjusting an amount of current flowing through at least one of the two sense nodes;
at least one latch circuit controlling the current adjustment gate;
two signal lines transmitting a power source voltage and a comparison voltage via the two input nodes respectively, the comparison voltage being obtained by subtracting an absolute value of a predetermined threshold voltage from an absolute value of the power source voltage; and
two switching elements provided between the two input nodes and the two signal lines, respectively,
wherein the latch circuit switches the current adjustment gate when the absolute value of an offset voltage is larger than the threshold voltage, the offset voltage being the minimum potential difference between the two input nodes necessary to output accurate data.

11. The semiconductor integrated circuit device according to claim 10, wherein
two current adjustment gates are provided in correspondence with the two sense nodes;
two latch circuits are provided in correspondence with the two current adjustment gates, and
in the case where the amplified signal is an inversion signal of a signal according to the threshold voltage when the power source voltage and the comparison voltage are applied to the two input nodes or the two sense nodes, one of the two latch circuits switches the current adjustment gate corresponding to the latch circuit.

12. The semiconductor integrated circuit device according to claim 10, wherein the current adjustment gate adjusts a current amount between the two sense nodes and a ground potential.

13. The semiconductor integrated circuit device according to claim 11, wherein the current adjustment gate adjusts a current amount between the two sense nodes and the power source voltage.

14. The semiconductor integrated circuit device according to claim 10, wherein the current adjustment gate is provided for one of the two sense nodes, the one of the two sense nodes being not provided with the output node.

15. A trimming method of a semiconductor integrated circuit device comprising: two bit lines connected to a memory cell and making a pair; two input nodes making a pair; two sense nodes transmitting a signal difference input to the two input nodes or an amplified signal according to a signal difference between the two bit lines; an output node outputting the amplified signal from one of the two sense nodes; at least one current adjustment gate adjusting an amount of current flowing through each of the two sense nodes; at least one latch circuit controlling the current adjustment gate; two signal lines transmitting a power source voltage and a comparison voltage via the two input nodes respectively, the comparison voltage being obtained by subtracting a predetermined threshold voltage from the absolute value of the power source voltage; and two switching elements provided between the two input nodes or the two sense nodes and the two signal lines, respectively,
the method comprising:
applying the power source voltage and the comparison voltage to the two input nodes; and
switching the current adjustment gate by the latch circuit in the case where the amplified signal is an inversion signal of a signal according to the threshold voltage.

16. The trimming method of a semiconductor integrated circuit device according to claim 15, wherein the latch circuit switches the current adjustment gate when the absolute value of an offset voltage is larger than the threshold voltage, the offset voltage being the minimum potential difference between the two input nodes necessary to output accurate data.

17. The trimming method of a semiconductor integrated circuit device according to claim 15, wherein the current adjustment gate is provided for one of the two sense nodes, the one of the two sense nodes being not provided with the output node.

18. The semiconductor integrated circuit device according to claim 16, wherein the current adjustment gate is provided for one of the two sense nodes, the one of the two sense nodes being not provided with the output node.

* * * * *